(12) United States Patent
Zhou et al.

(10) Patent No.: US 12,250,864 B2
(45) Date of Patent: Mar. 11, 2025

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhenli Zhou, Beijing (CN); Ge Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/784,581

(22) PCT Filed: Jul. 30, 2021

(86) PCT No.: PCT/CN2021/109672
§ 371 (c)(1),
(2) Date: Jun. 10, 2022

(87) PCT Pub. No.: WO2023/004768
PCT Pub. Date: Feb. 2, 2023

(65) Prior Publication Data
US 2024/0407231 A1    Dec. 5, 2024

(51) Int. Cl.
*H10K 59/80* (2023.01)
*H10K 59/131* (2023.01)

(52) U.S. Cl.
CPC ....... *H10K 59/873* (2023.02); *H10K 59/1315* (2023.02)

(58) Field of Classification Search
CPC ........ H10K 59/10; H10K 59/17; H10K 59/19; H10K 59/1213; H10K 59/123;
(Continued)

(56) References Cited

U.S. PATENT DOCUMENTS

| 2003/0042852 A1 | 3/2003 | Chen |
| 2007/0292072 A1 | 12/2007 | Ramirez et al. |

(Continued)

FOREIGN PATENT DOCUMENTS

| CN | 102422452 A | 4/2012 |
| CN | 106129267 A | 11/2016 |

(Continued)

OTHER PUBLICATIONS

Burrasca et al., "Ink-jet Printing of PF6 for OLED Applications," AIP Conference Proceedings, Aug. 2008, pp. 324-326, vol. 1042, DOI: 10.1063/1.2989049 (3 Pages).

(Continued)

*Primary Examiner* — Brook Kebede
(74) *Attorney, Agent, or Firm* — BROOKS KUSHMAN P.C.

(57) ABSTRACT

Display substrate and display apparatus are provided. The display substrate includes a display area and a periphery area surrounding the former, and further includes: a signal line, basic spacers, compensation spacers, and an encapsulation structure, the signal line having a first section located at the periphery area; at least a part of the basic spacers is located at the display area; disposed in a first periphery area, an orthographic projection of the first periphery area onto a base of the display substrate at least partially overlaps with an orthographic projection of a side face of the first section onto the base; the layout density of the compensation spacers is greater than that of the basic spacers; the encapsulation structure includes organic and inorganic encapsu- (Continued)

lation layers arranged in a stack, and the organic and inorganic encapsulation layers cover the compensation spacers.

20 Claims, 6 Drawing Sheets

(58) Field of Classification Search
CPC ............... H10K 59/124; H10K 59/127; H10K 59/1315; H10K 59/179; H10K 59/873
See application file for complete search history.

(56) References Cited

U.S. PATENT DOCUMENTS

| | | |
|---|---|---|
| 2012/0056231 A1 | 3/2012 | Boerner et al. |
| 2012/0256204 A1 | 10/2012 | Yoshizumi et al. |
| 2018/0183009 A1 | 6/2018 | Chen et al. |
| 2019/0285959 A1* | 9/2019 | Guo .................. G02F 1/1333 |
| 2020/0033659 A1* | 1/2020 | Um .................. G02F 1/13439 |
| 2020/0335570 A1 | 10/2020 | Long |
| 2021/0066655 A1 | 3/2021 | Jiang et al. |
| 2021/0208446 A1 | 7/2021 | Yang et al. |
| 2021/0359252 A1 | 11/2021 | Wang et al. |
| 2022/0093895 A1 | 3/2022 | Zhang et al. |
| 2022/0199649 A1 | 6/2022 | Xu |

FOREIGN PATENT DOCUMENTS

| | | |
|---|---|---|
| CN | 106711330 A | 5/2017 |
| CN | 106848099 A | 6/2017 |
| CN | 107565056 A | 1/2018 |
| CN | 109065743 A | 12/2018 |
| CN | 109461840 A | 3/2019 |
| CN | 208637462 U | 3/2019 |
| CN | 109671750 A | 4/2019 |
| CN | 109830614 A | 5/2019 |
| CN | 109860411 A | 6/2019 |
| CN | 110518043 A | 11/2019 |
| CN | 211554586 U | 9/2020 |
| CN | 112002831 A | 11/2020 |
| WO | 2008142645 A1 | 11/2008 |

OTHER PUBLICATIONS

Werner, Ken, "Advances in OLEDs, IJP, Display Glass, and More," Information Display: Display Week, Sep. 19, 2020, pp. 44-48, vol. 36, Iss. 5, DOI: 10.1002/msid.1153 (5 Pages).

* cited by examiner

DISPLAY SUBSTRATE AND DISPLAY APPARATUS

CROSS-REFERENCE TO RELATED APPLICATION

This application is the U.S. national phase of PCT Application No. PCT/CN2021/109672 filed on Jul. 30, 2021, which is incorporated herein by reference in its entirety.

TECHNICAL FIELD

The present disclosure relates to the technical field of display, and more particularly to a display substrate and a display apparatus.

BACKGROUND

The organic light-emitting diode (OLED) display device is widely used in various fields, since the OLED display device is light and thin, has a high brightness, a low power consumption, a fast response, a high definition, a good flexibility, and a high light-emitting efficiency.

The OLED display device generally includes light-emitting elements and an encapsulation layer, and the encapsulation layer covers the light-emitting elements to prevent the vapor and oxygen from intruding into the interior of the light-emitting elements, and from eroding the organic light-emitting material layer in the light-emitting elements, thereby affecting the reliability of the OLED display device.

SUMMARY

The present disclosure is to provide a display substrate and a display apparatus.

To achieve this, the present disclosure provides the following technical solutions.

In a first aspect of the present disclosure, a display substrate is provided, including: a display area and a periphery area surrounding the display area; the display substrate further includes:
  a signal line, where the signal line includes a first section located at the periphery area;
  a plurality of basic spacers, where at least a part of the plurality of basic spacers are located at the display area;
  a plurality of compensation spacers disposed at a first periphery area, where an orthographic projection of the first periphery area onto a base of the display substrate at least partially overlaps with an orthographic projection of a side face of the first section onto the base; a layout density of the plurality of compensation spacers is greater than a layout density of the plurality of basic spacers; and
  an encapsulation structure, where the encapsulation structure includes an organic encapsulation layer and an inorganic encapsulation layer arranged in a stack, the organic encapsulation layer and the inorganic encapsulation layer covers the plurality of compensation spacers.

Alternatively, the first section includes a first target section, a side face of the first target section having a recess; a part of the inorganic encapsulation layer and a part of the organic encapsulation layer are both filled in the recess; and
  the orthographic projection of the first periphery area onto the base of the display substrate is located at a side of the orthographic projection of the first target section onto the base adjacent to the display area.

Alternatively, the first section further includes:
  a second target section, where at least a portion of the second target section is located between the first target section and the display area; the orthographic projection of the first periphery area onto the base of the display substrate at least partially overlaps with an orthographic projection of the second target section onto the base.

Alternatively, the display substrate further includes:
  a pixel definition layer and a planarization layer arranged in a stack, where the planarization layer is located between the pixel definition layer and the base; and
  the orthographic projection of the first target section onto the base does not overlap with an orthographic projection of the pixel definition layer onto the base and does not overlap with an orthographic projection of the planarization layer onto the base.

Alternatively, the orthographic projection of the second target section onto the base at least partially overlaps with the orthographic projection of the pixel definition layer onto the base; and/or the orthographic projection of the second target section onto the base at least partially overlaps with the orthographic projection of the planarization layer onto the base.

Alternatively, the plurality of compensation spacers include a plurality of first compensation spacers and/or a plurality of second compensation spacers, an orthographic projection of each of the plurality of first compensation spacers onto the base does not overlap with an orthographic projection of the signal line onto the base; an orthographic projection of each of the plurality of second compensation spacers onto the base at least partially overlaps with the orthographic projection of the signal line onto the base.

Alternatively, the periphery area includes a bonding area; the display substrate further includes a first barrier and a second barrier, where the first barrier surrounds the display area, and the second barrier surrounds the first barrier; and
  the signal line includes a power supply line, an orthographic projection of the first section of the power supply line onto the base is located between an orthographic projection of the first barrier onto the base and an orthographic projection of the display area onto the base; the first section is adjacent to the bonding area.

Alternatively, the display substrate further includes a scanning line, where at least a portion of the scanning line is located at the display area, the scanning line including a portion extending in a first direction;
  the power supply line includes a positive power supply line and a negative power supply line;
  an orthographic projection of a side face for a first section of the positive power supply line in the first direction onto the base at least partially overlaps with the orthographic projection of the first periphery area onto the base; and/or
  an orthographic projection of a side face for the first section of the negative power supply line in the first direction onto the base at least partially overlaps with the orthographic projection of the first periphery area onto the base.

Alternatively, the signal line includes a positive power supply line, where the positive power supply line includes: a first common connection part; at least a portion of the first common connection part extends in the first direction, the first common connection part including the first target section.

Alternatively, the first common connection part includes a first sub-pattern to an N-th sub-pattern, N being greater than or equal to 3, where the first sub-pattern to the N-th sub-pattern are sequentially arranged in a direction away from the display area, and the widths in the first direction for the first sub-pattern to the N-th sub-pattern gradually decrease; the second sub-pattern includes the second target section; the third sub-pattern includes the first target section and the second target section.

Alternatively, an orthographic projection of the first sub-pattern onto the base includes a first layout region; orthographic projections for at least a part of the compensation spacers onto the base is uniformly distributed on the first layout region; or, orthographic projections for a part of the basic spacers onto the base is located at the first layout region, and a layout density of the basic spacers at the first layout region is equal to the layout density of the plurality of basic spacers at the display area.

Alternatively, the positive power supply line further includes a second common connection part, a plurality of conductive connection parts, and two first line entry parts;

at least a portion of the second common connection part extends in the first direction, where the second common connection part is located at a side of the first common connection part away from the display area; the second common connection part is coupled to the first common connection part via the plurality of conductive connection parts; and at least a portion of the first line entry part extends in a second direction that intersects the first direction; the first line entry part is located at a side of the second common connection part away from the display area, and the two first line entry parts are respectively coupled to the second common connection part.

Alternatively, the signal line further includes a negative power supply line, the negative power supply line including: a surrounding part and two second line entry parts; the surrounding part partially surrounds the display area, and two end parts of the surrounding part are coupled to the two second line entry parts in one-to-one correspondence; at least a portion of the second line entry part extends in the second direction; the end part of the surrounding part includes the first target section and the second target section.

Alternatively, orthographic projections for a part of the compensation spacers onto the base at least partially overlaps with an orthographic projection of the end part of the surrounding part onto the base Alternatively, the display substrate further includes a first barrier and a second barrier, where the first barrier surrounds the display area, and the second barrier surrounds the first barrier; and in the first direction, a first spacing area is provided between an orthographic projection of the first common connection part onto the base and an orthographic projection of the end part of the surrounding part onto the base, where the first spacing area is located between an orthographic projection of the first barrier onto the base and an orthographic projection of the display area onto the base; orthographic projections for at least a part of the compensation spacers onto the base is uniformly distributed on the first spacing area.

Alternatively, at least a portion of an orthographic projection of the first common connection part onto the base is located between an orthographic projection of the end part of the surrounding part onto the base and an orthographic projection of the display area onto the base; and in the second direction, a second spacing area is provided between at least a portion of the orthographic projection of the first common connection part onto the base and the orthographic projection of the end part of the surrounding part onto the base; orthographic projections for a part of the compensation spacers onto the base is located at the second spacing area.

Alternatively, the encapsulation structure includes a first inorganic encapsulation layer, an organic encapsulation layer, and a second inorganic encapsulation layer which are sequentially disposed in a direction away from the base; a part of the first inorganic encapsulation layer and a part of the organic encapsulation layer are both filled in the recess, and the second inorganic encapsulation layer is not filled in the recess.

Alternatively, the compensation spacers disposed in the same layer and formed by the same material as the pixel definition layer or the basic spacers.

Alternatively, the display substrate further includes a first source-drain metal layer and a second source-drain metal layer, the first source-drain metal layer is located between the second source-drain metal layer and the base; a portion of the signal line is disposed in the same layer and formed by the same material as the first source-drain metal layer, and another portion of the signal line is disposed in the same layer and formed by the same material as the second source-drain metal layer.

Based on the technical solution of the display substrate, in a second aspect of the present disclosure, a display apparatus is provided, including the display substrate provided by the embodiments.

BRIEF DESCRIPTION OF THE DRAWINGS

The accompanying drawings described herein are used to provide a further understanding of the present disclosure and constitute a part of the present disclosure. The exemplary embodiments of the present disclosure and related descriptions are used to explain the present disclosure and do not constitute an undue limitation of the present disclosure. In the drawings.

DETAILED DESCRIPTION

In order to further illustrate the display substrate and the display apparatus provided by embodiments of the present disclosure, the following detailed description is given in conjunction with the accompanying drawings.

Figure 1:
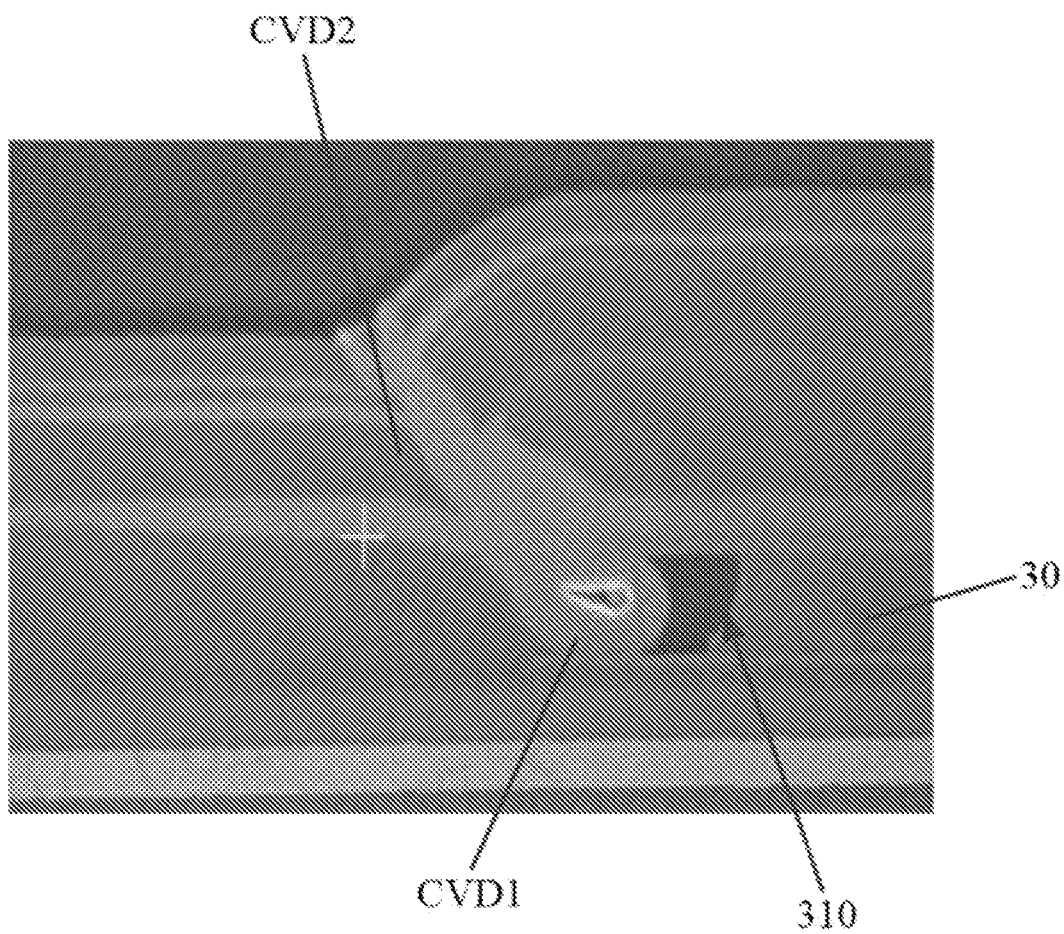
FIG. 1 is a first schematic illustration of an encapsulation structure adjacent to a recess according to an embodiment of the present disclosure.

As shown in FIG. 1, embodiments of the present disclosure provide a display substrate including a base, a signal line 30 and an encapsulation structure disposed onto the base; a side face of the signal line 30 has a recess 310; the encapsulation structure includes a first inorganic encapsulation layer CVD1, an organic encapsulation layer (not shown in FIG. 1), and a second inorganic encapsulation layer CVD2, which are sequentially stacked onto the base in a direction away from the base, the first inorganic encapsulation layer CVD1 being filled in the recess 310, and the organic encapsulation layer is not filled in the recess 310.

In the above-mentioned display substrate, since there is no organic encapsulation layer at the recess 310, there is a stress concentration caused by the first inorganic encapsulation layer CVD1 and the second inorganic encapsulation layer CVD2 in the vicinity of the recess 310, and a surface of the second inorganic encapsulation layer CVD2 facing away from the base is not sufficiently flat. This is liable to cause a break in the vicinity of the recess 310, which may provide a channel for the intrusion of water vapor and oxygen. As a result, the display area of the display substrate is prone to a GDSX (growing small black dots) defect in the reliability testing for the display substrate.

Figure 2:
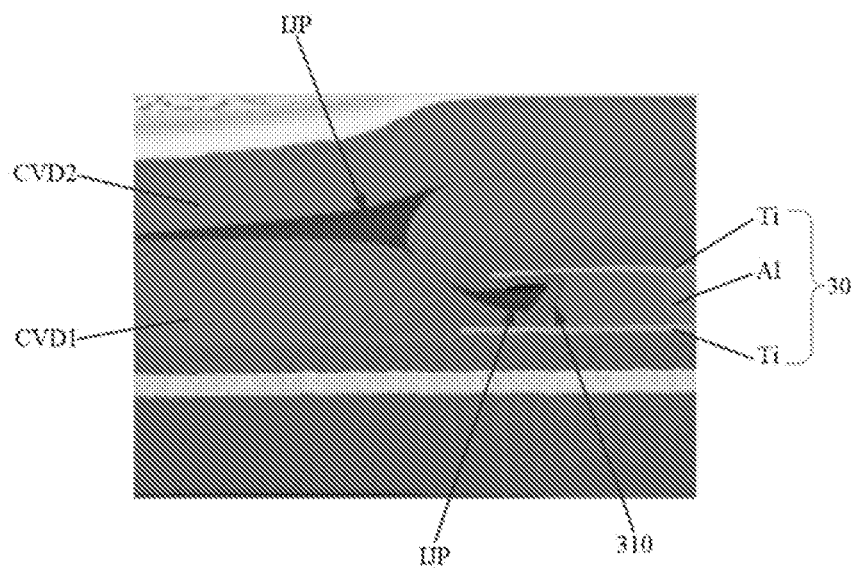
FIG. 2 is a second schematic illustration of an encapsulation structure adjacent to a recess according to an embodiment of the present disclosure.
Figure 3:
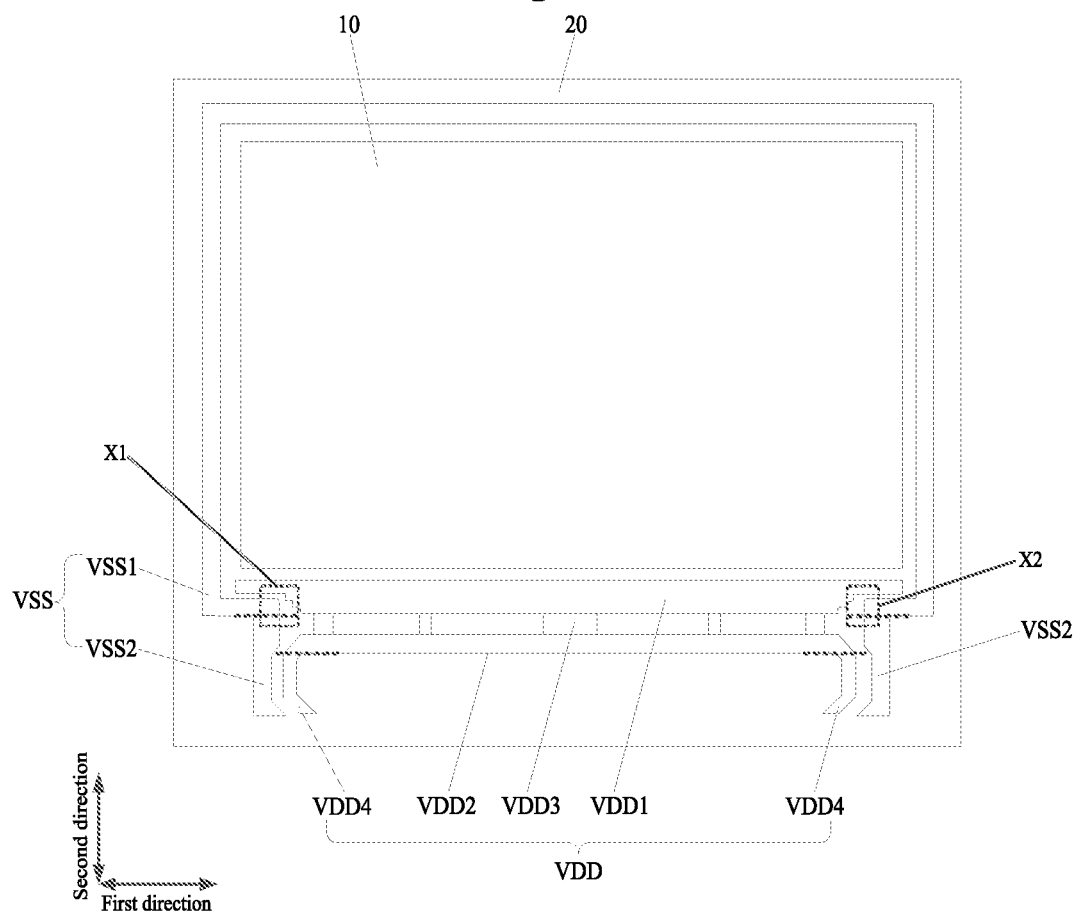
FIG. 3 is a schematic layout of a positive power supply line and a negative power supply line in a display substrate provided by an embodiment of the present disclosure.

Referring to FIGS. 2, 3, 6, 8 and 11, embodiments of the present disclosure provide a display substrate, including a display area 10 and a periphery area 20 enclosing the display area; the display substrate further includes:
- a signal line 30 (including positive power supply line(s) VDD and negative power supply line(s) VSS as shown in FIG. 3), where the signal line 30 includes a first section located at the periphery area 20;
- a plurality of basic spacers 41, where at least a part of the plurality of basic spacers 41 is located at the display area 10;
- a plurality of compensation spacers 40 disposed at a first periphery area 201, where an orthographic projection of the first periphery area 201 onto the base of the display substrate at least partially overlaps with an orthographic projection of a side face of the first section onto the base; a layout density for the compensation spacers 40 is greater than a layout density for the basic spacers 41; and
- an encapsulation structure, where the encapsulation structure includes an organic encapsulation layer IJP and an inorganic encapsulation layer (e. g. a first inorganic encapsulation layer CVD1) arranged in a stack, the organic encapsulation layer IJP and the inorganic encapsulation layer covers the plurality of compensation spacers 40.

Illustratively, the periphery area includes a bonding area, and the orthographic projection of the first section onto the base is located between the orthographic projection of the display area onto the base and the orthographic projection of the bonding area onto the base.

Figure 6:
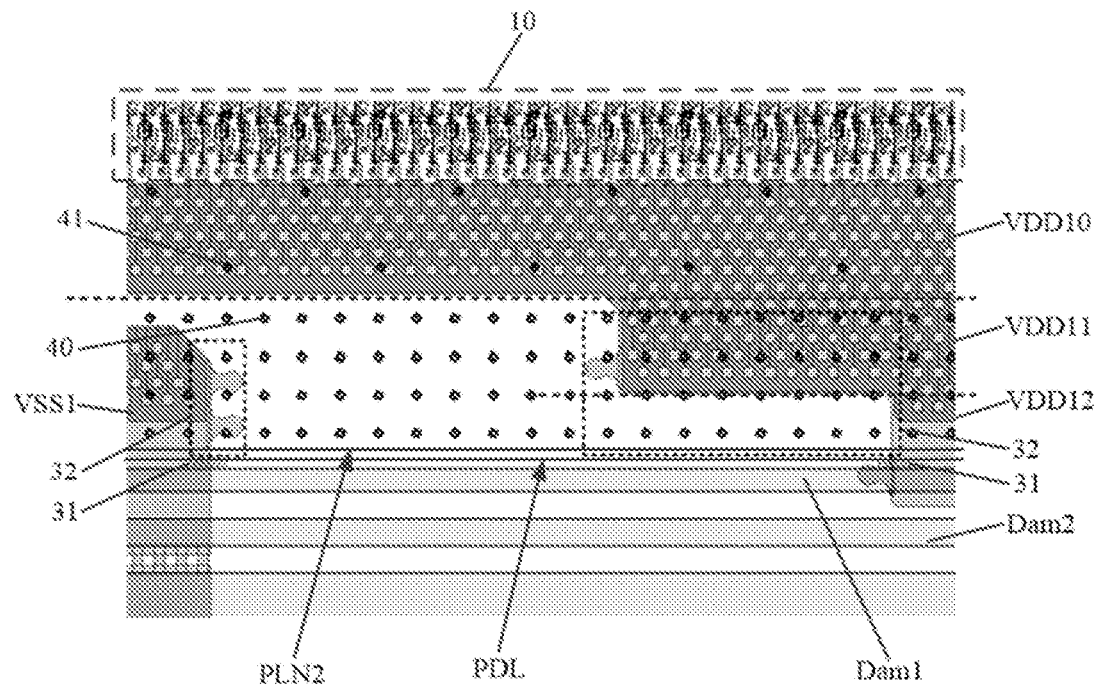
FIG. 6 is an enlarged view of X1 section in FIG. 3.
Figure 7:
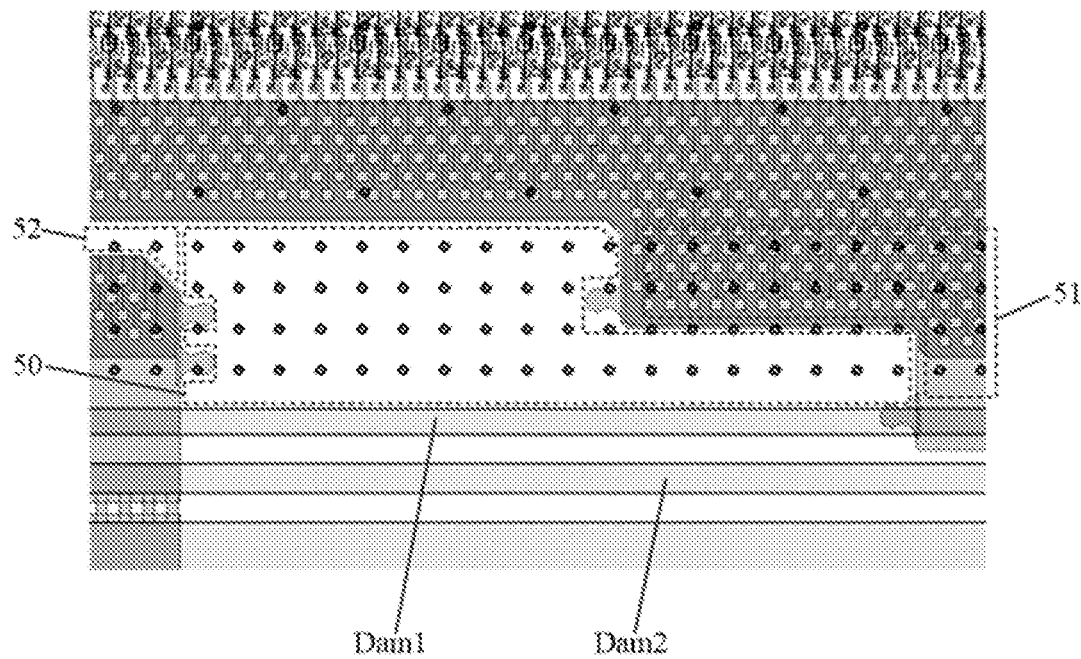
FIG. 7 is a schematic view of a spacing area and a layout region in FIG. 6.
Figure 8:
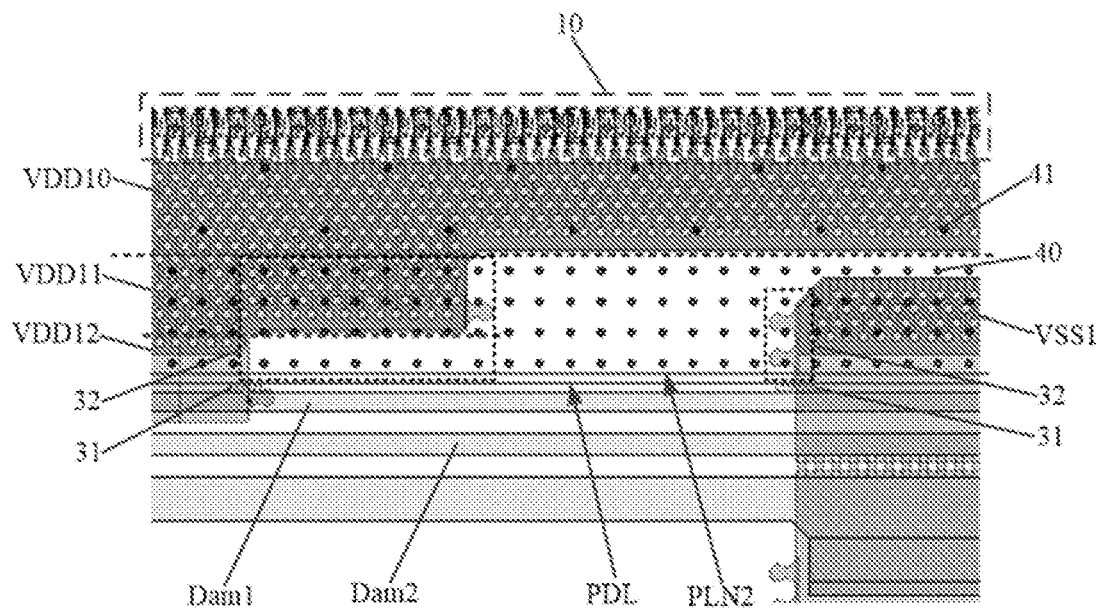
FIG. 8 is an enlarged view of X2 section in FIG. 3.
Figure 9:
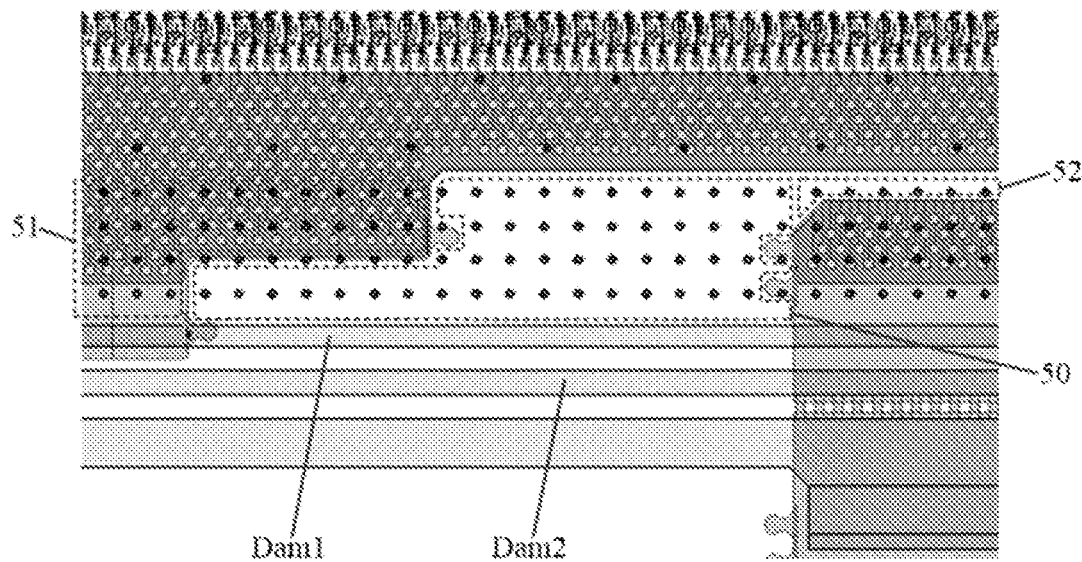
FIG. 9 is a schematic view of a spacing area and a layout region in FIG. 8.

As shown in FIGS. 6 and 8, at least some of the basic spacers 41 are located at the display area 10. The layout density of the compensation spacers 40 is greater than the layout density of the basic spacers 41.

Illustratively, some basic spacers of the basic spacers 41 is located at the display area 10, and the other basic spacers of the basic spacers 41 is located at the periphery area 20. Illustratively, the other basic spacers of the basic spacers 41 are located between the compensation spacers 40 and the display area 10.

Illustratively, both the basic spacers 41 and the compensation spacers 40 can function as supporters.

Illustratively, the layout density of the compensation spacers 40 is greater than or equal to twice of the layout density of the basic spacers 41.

By arranging the layout density of the compensation spacers 40 to be greater than the layout density of the basic spacers 41, the organic encapsulation material can be introduced into a region where the compensation spacers 40 are located more easily, such that an effective encapsulation for the region where the compensation spacers 40 are located can be realized.

Illustratively, the compensation spacers 40 are distributed in the periphery area 20.

Illustratively, the orthographic projection of the first periphery area 201 onto the base is located between the orthographic projection of the display area onto the base and the orthographic projection of the bonding area onto the base.

Illustratively, the compensation spacers 40 have the same function as conventional spacers for supporting.

Illustratively, the compensation spacers 40 each has a cylindrical shapes.

Illustratively, the display substrate includes the following elements sequentially arranged in a stack in a direction away from the base: an active layer, a first gate insulation layer, a first gate metal layer, a second gate insulation layer, a second gate metal layer, an interlayer insulation layer, a first source-drain metal layer, a first planarization layer, a second source-drain metal layer, a second planarization layer, an anode layer, a pixel definition layer, a light-emitting function layer, a cathode, and an encapsulation structure.

Illustratively, the display substrate does not include a passivation layer.

Illustratively, the encapsulation structure includes an organic encapsulation layer IJP and an inorganic encapsulation layer arranged in a stack, the inorganic encapsulation layer includes a first inorganic encapsulation layer CVD1 and a second inorganic encapsulation layer CVD2, the first inorganic encapsulation layer CVD1 is located between the organic encapsulation layer IJP and the base, and the second inorganic encapsulation layer CVD2 is located at a side of the organic encapsulation layer IJP facing away from the base.

According to the specific structure of the display substrate, it can be seen that in the display substrate provided by the embodiments of the present disclosure, the plurality of compensation spacers 40 are provided on the first periphery area 201, and the orthographic projection of the first periphery area 201 onto the base of the display substrate is arranged to be at least partially overlapped with the orthographic projection of the side face of the first section onto the base. In this way, the plurality of compensation spacers 40 can let the liquid organic encapsulation material flowing to the side face of the first section. This can not only be advantageous for the flatness of the inorganic encapsulation material subsequently formed at the side face of the first section, but also prevent a direct contact between the inorganic encapsulation layers located above and below the organic encapsulation layer IJP at the side face of the first section, thereby effectively reducing the stress of the encapsulation structure adjacent to the side face of the first section. Thus, in the display substrate provided by the embodiments of the present disclosure, it is ensured that the encapsulation structure has a better morphology at the encapsulated edge at the side facing away from the base, the risk of the encapsulation structure being broke at a position adjacent to the side face of the first section can be reduced, thereby effectively reducing the risk of a GDSX defect for the display substrate.

Furthermore, in the display substrate provided by the embodiments of the present disclosure, the liquid organic encapsulation material is introduced into the side face of the first section through the compensation spacers 40, and the amount of the liquid organic encapsulation material does not need to be increased, so that the organic encapsulation material can be effectively prevented from being overflowed out of the barrier structure around the display substrate.

Referring to FIGS. 2, 3, 6 and 8, in some embodiments, the first section includes a first target section 31, a side face of the first target section 31 having a recess 310; some of the inorganic encapsulation layer (e. g. the first inorganic encapsulation layer CVD1) and some of the organic encapsulation layer IJP are both filled in the recess 310; and the orthographic projection of the first periphery area 201 onto the base of the display substrate is located at a side of the orthographic projection of the first target section 31 onto the base adjacent to the display area 10.

As shown in FIG. 2, Illustratively, the signal line 30 is formed by a stack including a titanium metal layer (Ti), an aluminum metal layer (Al) and a titanium metal layer (Ti). After the signal line 30 is formed, during the process of etching to form the anode layer, the aluminum metal layer in the middle of the signal line 30 will be laterally etched, so that borders of two layers of titanium metal layers may exceed a border of the aluminum metal layer at the side face of the signal line 30, to form the recess 310 at the side face of the signal line 30.

Illustratively, orthographic projections for the plurality of compensation spacers 40 onto the base of the display substrate is located within a preset range near the orthographic projection of the side face of the first target section 31 onto the base. Illustratively, the preset range includes: a circle region with a centerpoint of the orthographic projection for the side face of the first target section 31 onto the base as the center of the circle and R as the radius of the circle. R is greater than or equal to 500 microns.

Illustratively, the orthographic projections for the plurality of compensation spacers 40 onto the base of the display substrate are distributed in an array around the orthographic projection of the side face of the first target section 31 onto the base.

Illustratively, the recess 310 is fully filled with the first inorganic encapsulation layer CVD1 and the organic encapsulation layer IJP.

Illustratively, the orthographic projection of the first periphery area 201 onto the base of the display substrate at least partially overlaps with the orthographic projection of the first target section 31 onto the base.

Illustratively, the first target section is in direct contact with the encapsulation structure.

In the display substrate provided by the above-mentioned embodiments, a plurality of compensation spacers 40 are disposed near the recess 310 at the side face of the first target section 31, and these compensation spacers 40 function as introducing a flow, the fluidity of the liquid organic encapsulation material can be improved, and thus the liquid organic encapsulation material can be introduced into the recess 310 more easily, and the recess 310 can be fully filled. In this way, the subsequently formed inorganic encapsulation layer can be prevented from filling in the recess 310, which not only helps to improve the flatness of the subsequently formed inorganic encapsulation materials, but also can prevent the inorganic encapsulation layers located above and below the organic encapsulation layer IJP from being directly contacted at a location adjacent to the recess 310, thereby effectively dispersing the stress of the encapsulation structure adjacent to the recess 310. Therefore, in the display substrate provided by the above-mentioned embodiments, it is ensured that the encapsulation structure has a better morphology for the encapsulated edge at the side facing away from the base, and the risk of the encapsulation structure being broke at a location adjacent to the recess 310 can be reduced, thereby effectively reducing the risk of a GDSX defect occurring at the display substrate.

Furthermore, in the display substrate provided by the above-mentioned embodiments, the liquid organic encapsulation material is introduced into the recess 310 through the compensation spacers 40, and the amount of the liquid organic encapsulation material does not need to be increased, so that the organic encapsulation material can be effectively prevented to be overflowed to the outside of the barrier structure at the periphery of the display substrate.

As shown in FIGS. 3, 6 and 8, in some embodiments, the first section further includes:

a second target section 32, where the second target section 32 is located at the periphery area 20, at least a portion of the second target section 32 being located between the first target section 31 and the display area 10; the orthographic projection of the first periphery area 201 onto the base of the display substrate at least partially overlaps with the orthographic projection of the second target section onto the base.

Illustratively, the orthographic projection of the first periphery area 201 onto the base of the display substrate covers the orthographic projection of the second target section onto the base.

Illustratively, orthographic projections for the plurality of compensation spacers 40 onto the base are also located around the orthographic projection of the second target section 32 onto the base.

Illustratively, a side face of the second target section 32 also has a recess.

Illustratively, the second target section 32 is coupled to the first target section 31.

Illustratively, the orthographic projections of the plurality of compensation spacers 40 onto the base of the display substrate are located within a preset range near the orthographic projection of the side face of the second target section 32 onto the base. Illustratively, the preset range includes: a circle region with a centerpoint of the orthographic projection of the side face of the second target section 32 onto the base as the center of the circle and R as the radius of the circle. R is greater than or equal to 500 microns.

Illustratively, the orthographic projections for the plurality of compensation spacers 40 onto the base of the display substrate are distributed in an array around the orthographic projection of the side face of the second target section 32 onto the base.

By arranging the orthographic projection of the first periphery area 201 onto the base of the display substrate to be at least partially overlapped with the orthographic projection of the second target section onto the base, the orthographic projections for the plurality of compensation spacers 40 onto the base can be located around the orthographic projection of the second target section 32 onto the base, so that through these compensation spacers 40, the organic packaging material can be introduced into a region where the second target section 32 is located, and further, into the region where the first target section 31 is located. Thus, in the display substrate provided by the above-mentioned embodiments, the liquid organic encapsulation material can be introduced into the recess 310 more effectively to fully fill in the recess 310, thereby reducing the risk of the GDSX defect occurring at the display substrate more effectively.

As shown in FIGS. 6 and 8, in some embodiments, the display substrate further includes:

a pixel definition layer and a planarization layer arranged in a stack, where the planarization layer is located between the pixel definition layer and the base; a border of the pixel definition layer PDL and a border of the planarization layer PLN2 are illustrated in FIGS. 6 and 8. In FIGS. 6 and 8, the pixel definition layer is disposed between the border of the pixel definition layer PDL and the display area 10, and a second planarization layer is provided between the border of the planarization layer PLN2 and the display area 10. The pixel definition layer and the second planarization layer may also be disposed in other positions.

The orthographic projection of the first target section 31 onto the base does not overlap with an orthographic projection of the pixel definition layer onto the base, and also does not overlap with the orthographic projection of the planarization layer onto the base.

Illustratively, the signal line 30 includes a first conductive layer and a second conductive layer coupled to the first conductive layer, where the first conductive layer is located between the base and the second conductive layer. Illustratively, the first conductive layer is formed by the first source-drain metal layer and the second conductive layer is formed by the second source-drain electrode metal layer. Illustratively, the first conductive layer is covered by the pixel definition layer and the first planarization layer. The second conductive layer includes the first target section 31 and the second target section 32.

It is noted that, in FIGS. 6 to 9, both VDD and VSS are illustrated to include the first conductive layer and the second conductive layer.

Taking FIG. 6 as an example, a third sub-pattern in FIG. 6 includes the first conductive layer and the second conductive layer which are stacked, where the first conductive layer has a darker color and a smaller area, and the first conductive layer is disposed with square via holes distributed in array; the second conductive layer color has a lighter color and a larger area.

Illustratively, a side face of the first conductive layer also has a recess, this recess can be covered by the pixel definition layer and the first planarization layer, and thus the flatness of the encapsulation structure and the stress of the encapsulation structure will not be affected.

Illustratively, the first target section 31 is not covered by the second planarization layer and the pixel definition layer, and the first target section 31 may be in contact with the encapsulation structure.

As shown in FIGS. 6 and 8, in some embodiments, the orthographic projection of the second target section 32 onto the base at least partially overlaps with an orthographic projection of the pixel definition layer onto the base; and/or at least partially overlaps with an orthographic projection of the planarization layer onto the base.

The second target section 32 and/or the planarization layer can cover at least a portion of the second target section 32, so as to prevent the recess at the side face of the second target section 32 from affecting the flatness and stress of the encapsulation structure.

Figure 10:
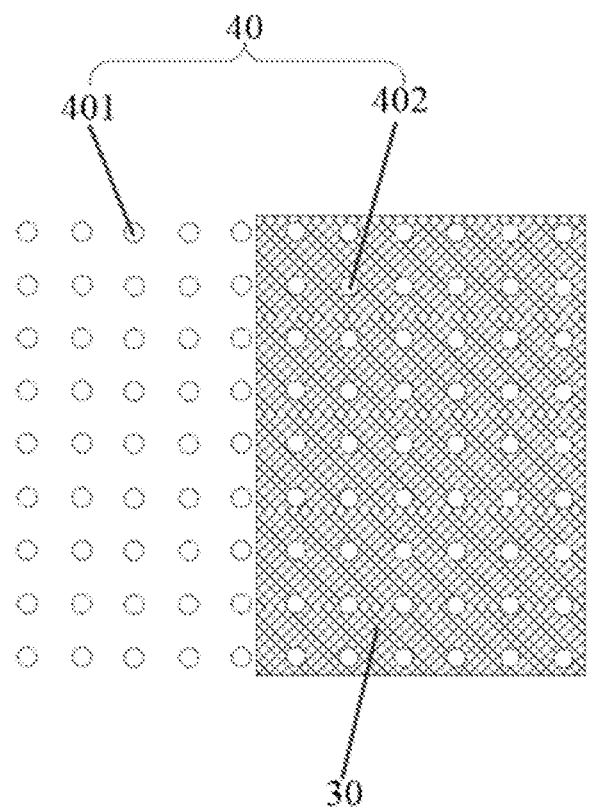
FIG. 10 is a schematic layout of a signal line and compensation spacers provided by an embodiment of the present disclosure.
Figure 11:
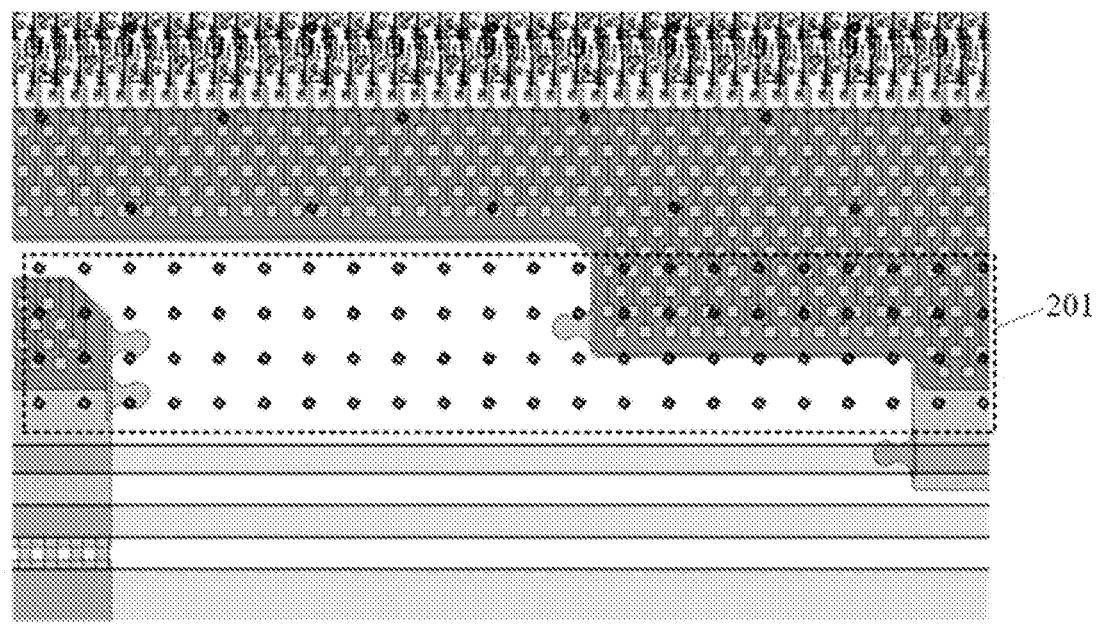
FIG. 11 is a schematic diagram of a first periphery area in a display substrate provided by an embodiment of the present disclosure.

As shown in FIG. 10, in some embodiments, the plurality of compensation spacers 40 includes a plurality of first compensation spacers 401 and/or a plurality of second compensation spacers 402, orthographic projections for the plurality of first compensation spacers 401 onto the base does not overlap with the orthographic projection of the signal line 30 onto the base; orthographic projections for the plurality of second compensation spacers 402 onto the base at least partially overlaps with the orthographic projection of the signal line 30 onto the base.

The above-mentioned arrangement facilitates introducing the organic encapsulation material, through the compensation spacers 40, into the vicinity of the recess 310 of the signal line 30, then introducing the liquid organic encapsulation material into the recess 310 more effectively to fully fill in the recess 310, thereby reducing the risk of the GDSX occurring at the display substrate more effectively.

As shown in FIGS. 6 and 8, in some embodiments, the periphery area includes a bonding area;

the display substrate further includes a first barrier Dam1 and a second barrier Dam2, where the first barrier Dam1 encloses the display area 10, and the second barrier Dam2 encloses the first barrier Dam1; and the signal line 30 includes a power supply line, an orthographic projection of a first section of the power supply line onto the base is located between an orthographic projection of the first barrier Dam1 onto the base and the orthographic projection of the display area 10 onto the base; the first section is adjacent to the bonding area.

Illustratively, the first barrier Dam1 and the second barrier Dam2 are used to block the organic encapsulation material to limit the border of the organic encapsulation layer IJP at a side of the second barrier Dam2 facing the display area 10.

Illustratively, the power supply line includes a positive power supply line and/or a negative power supply line.

By arranging the orthographic projection of the first section of the power supply line onto the base to be located between the orthographic projection of the first barrier Dam1 onto the base and the orthographic projection of the display area 10 onto the base, the first section of the power supply line can be covered better by the organic encapsulation layer IJP.

In some embodiments, the display substrate further includes a scanning line, at least a portion of the scanning line is located at the display area, the scanning line including a portion extending in a first direction;

the power supply line includes a positive power supply line and a negative power supply line;

an orthographic projection of a side face for a first section of the positive power supply line onto the base in the first direction at least partially overlaps with the orthographic projection of the first periphery area 201 onto the base; and/or an orthographic projection of a side face for a first section of the negative power supply line onto the base in the first direction at least partially overlaps with the orthographic projection of the first periphery area 201 onto the base.

Illustratively, the scanning line includes a gate line.

With the above-mentioned arrangement, the organic encapsulation material can be introduced, through the compensation spacers 40, into the vicinity of the first section of the positive power supply line and the first section of the negative power supply line better, thereby achieving a good encapsulation for the first section of the positive power supply line and the first section of the negative power supply line, reducing the risk of the encapsulation structure being broke in the vicinity of the first section of the positive power supply line and the first section of the negative power supply line. The water vapor and oxygen can be prevented from being transmitted to the display area 10 via a transmission path formed by the first section of the positive power supply line and the first section of the negative power supply line.

As shown in FIGS. 3, 4, 6, and 8, in some embodiments, the signal line 30 includes the positive power supply line VDD, the positive power supply line VDD includes a first common connection part VDD1; at least a portion of the first common connection part VDD1 extends in the first direction, the first common connection part VDD1 includes the first target section 31.

Illustratively, the display substrate further includes a plurality of sub-power supply lines, at least some of which are disposed in the display area 10, for providing a power signal for each sub-pixel driving circuit in the display area 10. At least some of the sub-power supply lines extend in a second direction, the plurality of sub-power supply lines is coupled to the first common connection part VDD1, and the first common connection part VDD1 is configured for transmitting a positive power signal to each sub-power supply line.

Illustratively, the first common connection part VDD1 includes a first conductive layer and a second conductive layer.

By arranging the first common connection part VDD1 to include the first target section 31, the organic encapsulation material can be introduced into the vicinity of the first common connection part VDD1 through the compensation spacers 40 more effectively, so as to achieve a good encapsulation for the first common connection part VDD1. The risk of encapsulation structure being broke in the vicinity of the first common connection part VDD1 can be reduced, and the water vapor and oxygen can be prevented from being transmitted to the display area 10 through the first common connection part VDD1 as a transmission path.

Figure 4:
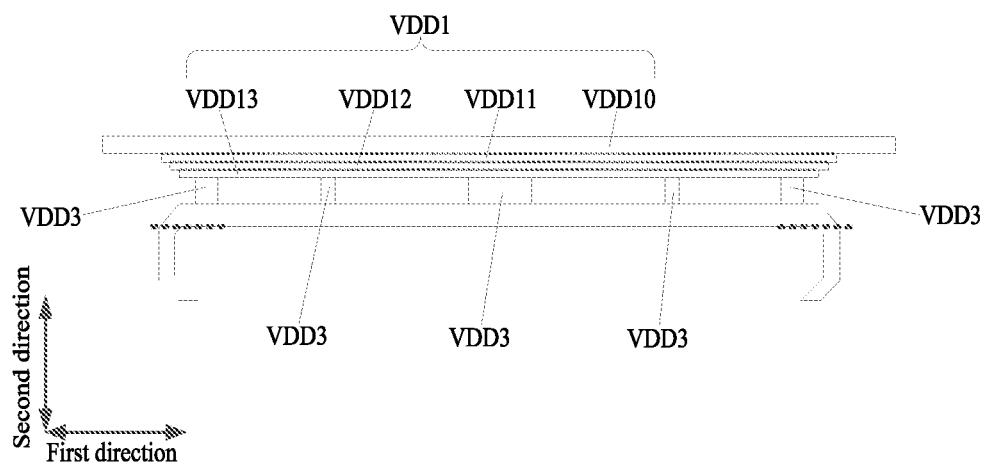
FIG. 4 is a first schematic diagram of a positive power supply line in a display substrate provided by an embodiment of the present disclosure.

As shown in FIG. 4, in some embodiments, the first common connection part VDD1 includes a first sub-pattern VDD10 to an N-th sub-pattern, N being greater than or equal to 3, the first sub-pattern VDD10 to the N-th sub-pattern are sequentially arranged in a direction away from the display area 10, and the width of the first sub-pattern VDD10 in the first direction to the width of the N-th sub-pattern in the first direction gradually narrows; the second sub-pattern VDD11 includes the second target section 32; the third sub-pattern VDD12 includes the first target section 31 and the second target section 32.

Illustratively, the first sub-pattern VDD10 to the second sub-pattern VDD11 each includes the first conductive layer and the second conductive layer. Illustratively, an orthographic projection of the first conductive layer in the first sub-pattern VDD10 onto the base at least partially overlaps with an orthographic projection of the second conductive layer in the first sub-pattern VDD10 onto the base. Illustratively, an orthographic projection of the first conductive layer in the second sub-pattern VDD11 onto the base at least partially overlaps with an orthographic projection of the second conductive layer in the second sub-pattern VDD11 onto the base. Illustratively, an orthographic projection of the first conductive layer in the third sub-pattern VDD12 onto the base at least partially overlaps with an orthographic projection of the second conductive layer in the third sub-pattern VDD12 onto the base.

Illustratively, the fourth sub-pattern VDD13 to the N-th sub-pattern includes only the first conductive layer.

Illustratively, the width of the first sub-pattern VDD10 in the first direction to the width of the N-th sub-pattern in the first direction gradually decrease, forming a step-like structure on both sides of the first common connection part VDD1. This arrangement not only helps to reduce the resistance of the positive power supply line VDD, but also reduces an interference between the positive power supply line VDD and the negative power supply line VSS and reduces the risk of a short circuit occurring between the positive power supply line VDD and the negative power supply line VSS.

In some embodiments, the orthographic projection of the first sub-pattern VDD10 onto the base includes a first layout region; orthographic projections for at least some of the compensation spacer 40 onto the base is uniformly distributed in the first layout region.

By arranging the orthographic projections for at least some of the compensation spacer 40 onto the base to be uniformly distributed in the first layout region, the organic encapsulation material can be introduced into the first layout region through the compensation spacers 40 more effectively, thereby achieving a good encapsulation for the first sub-pattern VDD10, and reducing the risk of the encapsulation structure be broke at a location adjacent to the first sub-pattern VDD10, and preventing the water vapor and oxygen from being transmitted to the display area 10 via the first sub-pattern VDD10 as a transmission path.

In some embodiments, the orthographic projection of some of the basic spacers 41 onto the base is located at the first layout region, and the layout density of the basic spacers 41 at the first layout region is equal to the layout density of the basic spacers 41 at the display area 10.

By arranging the orthographic projections for some of the basic spacers 41 to be located in the first layout region, the organic encapsulation material can be introduced into the first layout region through the basic spacers 41 more effectively, thereby achieving a good encapsulation for the first sub-pattern VDD10, and reducing the risk of the encapsulation structure be broke at a location adjacent to the first sub-pattern VDD10, and preventing the water vapor and oxygen from being transmitted to the display area 10 via the first sub-pattern VDD10 as a transmission path.

As shown in FIGS. 3 and 4, in some embodiments, the positive power supply line VDD further includes a second common connection part VDD2, a plurality of conductive connection parts VDD3, and two first line entry parts VDD4;

at least a portion of the second common connection part VDD2 extends in the first direction, where the second common connection part VDD2 is located at a side of the first common connection part VDD1 away from the display area 10; the second common connection part VDD2 is coupled to the first common connection part VDD1 via the plurality of conductive connection parts VDD3; and at least a portion of the first line entry part VDD4 extends in a second direction that intersects the first direction; the first line entry part VDD4 is located at a side of the second common connection part VDD2 away from the display area 10, and the two first line entry parts VDD4 are coupled to the second common connection part VDD2.

Illustratively, the second common connection part VDD2 is disposed opposite to the first common connection part VDD1 along the second direction, at least a portion of the conductive connection parts VDD3 extends in the second direction, the second common connection part VDD2 is coupled to the first common connection part VDD1 via the plurality of conductive connection parts VDD3, and the plurality of conductive connection parts VDD3 are arranged at intervals along the second direction.

Illustratively, the conductive connection parts VDD3 include only the first conductive layer.

Illustratively, the first direction includes a horizontal direction and the second direction includes a vertical direction.

Illustratively, the two first line entry parts VDD4 are respectively coupled to two ends of the second common connection part VDD2 in one-to-one correspondence.

By arranging the positive power supply line VDD as the above structure is advantageous in reducing the resistance of the positive power supply line VDD.

As shown in FIGS. 3, 6 and 8, in some embodiments, the signal line 30 also includes a negative power supply line VSS, the negative power supply line VSS including a surrounding part VSS1 and two second line entry parts VSS2; the surrounding part VSS1 partially surrounds the display area 10, and two end parts of the surrounding part VSS1 are respectively coupled to the two second line entry parts VSS2 in one-to-one correspondence; at least a portion of the second line entry parts VSS2 extends in the second direction; an end part of the surrounding part VSS1 includes the first target section 31 and the second target section 32.

Illustratively, the surrounding part VSS1 does not fully encloses the display area 10, with an opening of the surrounding part VSS1 facing towards a position where a driving chip of the display substrate is located. The surrounding part VSS1 is coupled to a cathode in the display substrate for transmitting a negative power signal to the cathode.

Illustratively, at least a portion of the second line entry parts VSS2 extends in the second direction, two end parts of the surrounding part VSS1 are respectively coupled to the two second line entry parts VSS2 in one-to-one correspondence, and the two second line entry parts VSS2 are coupled to the driving chip included in the display substrate to receive a negative power signal provided by the driving chip.

Illustratively, the surrounding part VSS1 includes the first conductive layer and the second conductive layer. Illustratively, the second line entry parts VSS2 include only the first conductive layer.

By arranging the end part of the surrounding part VSS1 to include the first target section 31 and the second target section 32, the organic encapsulation material can be introduced into the vicinity of the end part of the surrounding part VSS1 more effectively, thereby achieving a good encapsulation for the end part of the surrounding part VSS1, reducing the risk of encapsulation structure being broke at a location adjacent to the end part of the surrounding part VSS1, and preventing the water vapor and oxygen from being transmitted to the display area 10 through a transmission path formed by the end part of the surrounding part VSS1.

As shown in FIGS. 6 and 8, in some embodiments, the display substrate further includes a first barrier Dam1 and a second barrier Dam2, where the first barrier Dam1 encloses the display area 10, and the second barrier Dam2 encloses the first barrier Dam1; and i. the orthographic projection of the first target section 31 onto the base and the orthographic projection of the second target section 32 onto the base are both located between the orthographic projection of the first barrier Dam1 onto the base and the orthographic projection of the display area 10 onto the base.

Illustratively, the first barrier Dam1 and the second barrier Dam2 are used to block the organic encapsulation material to limit the border of the organic encapsulation layer IJP at a side of the second barrier Dam2 facing towards the display area 10.

By arranging both the orthographic projection of the first target section 31 onto the base and the orthographic projection of the second target section 32 onto the base to be located between the orthographic projection of the first barrier Dam1 onto the base and the orthographic projection of the display area 10 onto the base, both the first target section 31 and the second target section 32 can be well covered by the organic encapsulation layer IJP.

As shown in FIGS. 6 to 9, in some embodiments, the display substrate further includes a first barrier Dam1 and a second barrier Dam2, where the first barrier Dam1 encloses the display area 10, and the second barrier Dam2 encloses the first barrier Dam1; and i. in the first direction, there is a first spacing area 50 between the orthographic projection of the first common connection part VDD1 onto the base and the orthographic projection of the end part of the surrounding part VSS1 onto the base, and the first spacing area 50 is located between the orthographic projection of the first barrier Dam1 onto the base and the orthographic projection of the display area 10 onto the base; orthographic projections for at least some of the compensation spacers 40 onto the base is uniformly distributed in the first spacing area 50.

Illustratively, the first target section 31 and the second target section 32 are located near the first spacing area 50.

By arranging the orthographic projection for the at least some of the compensation spacers 40 onto the base to be uniformly distributed in the first spacing area 50, the organic encapsulation material can be introduced into the first spacing area 50 through the compensation spacers 40, thereby achieving good encapsulations for the first spacing area 50, and for the first target section 31 and the second target section 32 adjacent to the first spacing area 50, reducing the risk of the encapsulation structure being broke at a location adjacent to the first spacing area 50, and preventing the water vapor and oxygen from being transmitted to the display area 10 through a transmission path formed by the first spacing area 50.

Figure 5:
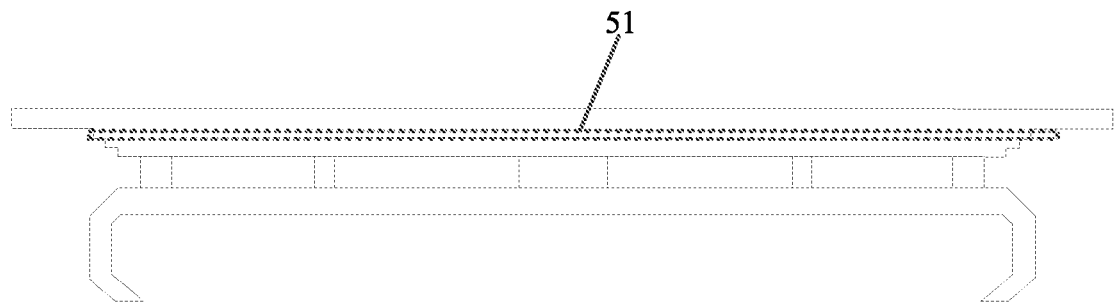
FIG. 5 is a second schematic of the a positive power supply line in a display substrate provided by an embodiment of the present disclosure.

As shown in FIG. 5, in some embodiments, the orthographic projection of the first common connection part VDD1 onto the base forms a first layout region 51, and the first layout region 51 is located between the orthographic projection of the first barrier Dam1 onto the base and the orthographic projection of the display area 10 onto the base. orthographic projections for at least a part of the compensation spacers 40 onto the base is uniformly distributed over the first layout region 51.

Illustratively, the orthographic projection of the second sub-pattern VDD11 onto the base and the orthographic projection of at least a portion of the third sub-pattern VDD12 onto the base form the first layout region 51.

By arranging the orthographic projections for at least some of the compensation spacers 40 onto the base to be uniformly distributed over, the first layout region 51, the organic encapsulation material can be introduced into positions where the second sub-pattern VDD11 and the at least a portion of the third sub-pattern VDD12 are located through the compensation spacers 40, thereby achieving good encapsulations for the second sub-pattern VDD11 and the third sub-pattern VDD12. The risk of the encapsulation structure being broke in the vicinity of the second sub-pattern VDD11 and the third sub-pattern VDD12 is reduced, and the water vapor and oxygen can be prevented from entering the display area 10 through the transmission path formed by the second sub-pattern VDD11 and the third sub-pattern VDD12.

As shown in FIGS. 6 and 8, in some embodiments, orthographic projections of some of the compensation spacers 40 onto the base is arranged to be at least partially overlapped with the orthographic projection of the end part of the surrounding part VSS1 onto the base.

In this manner, the organic encapsulation material can be introduced into the position where the end part of the surrounding part VSS1 is located through the compensation spacers 40, there by achieving a good encapsulation for the end part of the surrounding part VSS1, reducing the risk of encapsulation structure being broke at a location adjacent to the end part of the surrounding part VSS1, and preventing the water vapor and oxygen from being transmitted to the display area 10 via the end part of the surrounding part VSS1 as a transmission path.

As shown in FIGS. 6 to 9, in some embodiments, at least a portion of the orthographic projection of the first common connection part VDD1 onto the base is located between the orthographic projection of the end part of the surrounding part VSS1 onto the base and the orthographic projection of the display area 10 onto the base. In the second direction, there is a second spacing area 52 between at least a portion of the orthographic projection of the first common connection part VDD1 onto the base and the orthographic projection of the end part of the surrounding part VSS1 onto the base; orthographic projections for some of the compensation spacers 40 onto the base is located in the second spacing area 52.

Illustratively, at least a portion of the orthographic projection of the first sub-pattern VDD10, which is included in the first common connection part VDD1, onto the base, is located between the orthographic projection of the surrounding part VSS1 onto the base and the orthographic projection of the display area 10 onto the base.

Illustratively, the second spacing area 52 is located between at least a portion of the orthographic projection of the first sub-pattern VDD1 onto the base and the orthographic projection of the end part of the surrounding part VSS1 onto the base.

By arranging the orthographic projections for some of the compensation spacers 40 onto the base to be located in the second spacing area 52, the organic encapsulation material can be introduced into the second spacing area 52 through the compensation spacers 40, thereby achieving a good encapsulation for the second spacing area 52, reducing the risk of the encapsulation structure being broke at a location adjacent to the second spacing area 52, and preventing the water vapor and oxygen from being transmitted to the display area 10 via the second spacing area 52 as a transmission path.

As shown in FIG. 2, in some embodiments, the encapsulation structure includes a first inorganic encapsulation layer CVD1, an organic encapsulation layer IJP and a second inorganic encapsulation layer CVD2 which are sequentially arranged in a stack in a direction away from the base; a part of the first inorganic encapsulation layer CVD1 and a part of the organic encapsulation layer IJP are filled in the recess 310, and the second inorganic encapsulation layer CVD2 is not filled in the recess 310.

Illustratively, the recess 31 may be fully filled with the part of the first inorganic encapsulation layer CVD1 and the part of the organic encapsulation layer IJP=.

The above-mentioned arrangement prevents the second inorganic encapsulation layer CVD2 from filling in the recess 310, which is advantageous to improve the flatness of the second inorganic encapsulation material, thereby reducing the risk of the second inorganic encapsulation layer CVD2 being broke and reducing the risk of the GDSX defect occurring in the display substrate.

In some embodiments, the compensation spacers 40 are arranged in the same layer and formed by the same material as the pixel definition layer or the basic spacers 41.

Illustratively, each of the basic spacers 41 and the compensation spacers 40 may be formed in a single patterning process with the pixel definition layer.

Illustratively, the compensation spacers 40 and the basic spacers 41 may also be made of other organic or inorganic materials.

By arranging the compensation spacers 40 to be in the same layer and forming the same using the same material as the pixel definition layer or the basic spacers 41, the basic spacers 41, the compensation spacers 40 and the pixel definition layer can be formed in the same one patterning process, which is advantageous to simplify the manufacturing process of the display substrate and reduce the manufacturing cost of the display substrate.

In some embodiments, the display substrate further includes a first source-drain metal layer and a second source-drain metal layer, where the first source-drain metal layer are located between the second source-drain metal layer and the base; a portion of the signal line 30 is arranged in the same layer and formed by the same material as the first source-drain metal layer; another portion of the signal line 30 is arranged in the same layer and formed by the same material as the second source-drain metal layer.

Illustratively, there is no passivation layer between the second source-drain metal layer and the pixel definition layer.

Illustratively, a second conductive layer included in the signal line 30 is disposed in the same layer and formed by the same material as the second source-drain metal layer.

With the arrangement that there is no passivation layer between the second source-drain electrode metal layer and the pixel definition layer, a process using mask for manufacturing the passivation layer can be omitted, thereby effectively simplifying the manufacturing process of the display substrate and reducing the manufacturing cost of the display substrate.

Embodiments of the present disclosure also provide a display apparatus, including the display substrate provided by the embodiments described above.

In the display substrate provided by the above-mentioned embodiments, a plurality of compensation spacers 40 are disposed at the first periphery area 201, and the orthographic projection of the first periphery area 201 onto the base of the display substrate is provided to be at least partially overlapped with the orthographic projection of the side face of the first section onto the base. In this way, the plurality of compensation spacers 40 can enable the liquid organic encapsulation material to flow to the side face of the first section, which is not only advantageous for the flatness of the inorganic encapsulation materials subsequently formed at the side face of the first section but also can prevent a direct contact between the inorganic encapsulation layers located above and below the organic encapsulation layer IJP of at the side face of the first section, thereby effectively reducing the stress of the encapsulation structure adjacent to the side face of the first section. Therefore, in the display substrate provided by the above-mentioned embodiments, it is ensured that the encapsulation structure has a better morphology for encapsulated edge at the side facing away from the base, and the risk of the encapsulation structure being broke at a location adjacent to the side face of the first section can be reduced, thereby effectively reducing the risk of the GDSX defect occurring at the display substrate.

Furthermore, in the display substrate provided by the above-mentioned embodiments, the liquid organic encapsulation material is introduced into the side face of the first section through the compensation spacers 40 without a need for increasing the amount of the liquid organic encapsulation material, the organic encapsulation material can be advantageously prevented from being overflowed outside the barrier structure around the display substrate.

Therefore, the display apparatus provided by the embodiments of the present disclosure also has the above-mentioned advantageous effects when including the above-mentioned display substrate, which will not be described in detail herein.

Note that the display apparatus may be any product or component with display function such as a television, a display, a digital photo frame, a mobile phone and a tablet computer, and the display apparatus may also include a flexible circuit board, a printed circuit board and a back plate.

It should be noted that the "same layer" in the embodiments of the present disclosure may refer to the film layer on the same structural layer. In other words, for example, the film layer in the same layer may be a layer structure formed by forming a film layer for forming a specific pattern by using the same film-forming process, and then patterning the film layer in a single patterning process with the same mask. Depending on the particular pattern, a single patterning process may include multiple exposure, developing, or etching processes, and the formed particular patterns in the layer structure may or may not be continuous. These particular patterns may also be at different heights or have different thicknesses.

In method embodiments of the present disclosure, the sequence number of each step cannot be used to define the sequence of various steps. For a person of ordinary skill in the art, variations in the sequence of various steps is also within the protection scope of the present disclosure.

It should be noted that various embodiments in this specification is described in a progressive manner, the same and similar parts among various embodiments can be referred to each other, and each embodiment focuses on the differences from the other embodiments. In particular, with regard to the method embodiment, since it is substantially similar to the product embodiment, the description thereof is relatively simple, and reference can be made to a description of the product embodiment for the relevant part.

Unless defined otherwise, technical or scientific terms used in this disclosure shall have the ordinary meaning as understood by one of ordinary skill in the art to which this disclosure belongs. The use of "first", "second", and the like in this disclosure does not denote any order, quantity, or importance, but rather is used to distinguish one element from another. The word "comprise" or "include", and the like, means that the presence of an element or item preceding the word encompasses the presence of the element or item listed after the word and equivalents thereof, but does not exclude other elements or items. The terms "connect", "couple", or "link", and the like are not limited to physical or mechanical connections, but may include electrical connections, whether direct or indirect. The terms "upper", "lower", "left", "right", etc. are used only to indicate a relative position relationship, which may change accordingly when the absolute position of the described object changes.

It will be understood that when an element such as a layer, film, region, or substrate is referred to as being "on" or "under" another element, it can be "directly on" or "directly under" the other element or intervening elements may be present.

In the above description for the embodiments, particular features, structures, materials, or characteristics may be combined in any suitable manner in any one or more of the embodiment or examples.

The foregoing is only specific implementations of the present disclosure, but the protection scope of the present disclosure is not limited thereto, and any person skilled in the art who is familiar with the present technical field would have readily conceived of changes or substitutions within the technical range disclosed in the present disclosure, and all would be covered by the protection range of the present disclosure. Accordingly, the protection range of this disclosure shall control over the protection range of the claims.

What is claimed is:

1. A display substrate, comprising: a display area and a periphery area surrounding the display area; the display substrate further comprising:
    a signal line, wherein the signal line comprises a first section located at the periphery area;
    a plurality of basic spacers, wherein at least a part of the plurality of basic spacers are located at the display area;
    a plurality of compensation spacers disposed at a first periphery area, wherein an orthographic projection of the first periphery area onto a base of the display substrate at least partially overlaps with an orthographic projection of a side face of the first section onto the base; a layout density of the plurality of compensation spacers is greater than a layout density of the plurality of basic spacers; and
    an encapsulation structure, wherein the encapsulation structure comprises an organic encapsulation layer and an inorganic encapsulation layer arranged in a stack, the organic encapsulation layer and the inorganic encapsulation layer covers the plurality of compensation spacers.

2. The display substrate according to claim 1, wherein the first section comprises a first target section, a side face of the first target section having a recess; a part of the inorganic encapsulation layer and a part of the organic encapsulation layer are both filled in the recess; and
    the orthographic projection of the first periphery area onto the base of the display substrate is located at a side of an orthographic projection of the first target section onto the base adjacent to the display area.

3. The display substrate according to claim 2, wherein the encapsulation structure comprises a first inorganic encapsulation layer, an organic encapsulation layer and a second inorganic encapsulation layer which are sequentially arranged in a stack in a direction away from the base; a part of the first inorganic encapsulation layer and a part of the organic encapsulation layer are both filled in the recess, and the second inorganic encapsulation layer is not filled in the recess.

4. The display substrate according to claim 1, wherein the first section further comprises:
a second target section, wherein at least a portion of the second target section is located between the first target section and the display area; the orthographic projection of the first periphery area onto the base of the display substrate at least partially overlaps with an orthographic projection of the second target section onto the base.

5. The display substrate according to claim 4, wherein the display substrate further comprises:
a pixel definition layer and a planarization layer arranged in a stack, wherein the planarization layer is located between the pixel definition layer and the base; and
the orthographic projection of the first target section onto the base does not overlap with an orthographic projection of the pixel definition layer onto the base and does not overlap with an orthographic projection of the planarization layer onto the base.

6. The display substrate according to claim 5, wherein the orthographic projection of the second target section onto the base at least partially overlaps with the orthographic projection of the pixel definition layer onto the base, and/or the orthographic projection of the second target section onto the base at least partially overlaps with the orthographic projection of the planarization layer onto the base.

7. The display substrate according to claim 5, wherein the compensation spacers are disposed in the same layer and formed by the same material as the pixel definition layer or the basic spacers.

8. The display substrate according to claim 4, wherein the signal line comprises a positive power supply line, the positive power supply line comprising: a first common connection part; wherein at least a portion of the first common connection part extends in the first direction, and the first common connection part includes the first target section.

9. The display substrate according to claim 8, wherein the first common connection part comprises a first sub-pattern to an N-th sub-pattern, N is greater than or equal to 3, wherein the first sub-pattern to the N-th sub-pattern are sequentially arranged in a direction away from the display area, and the widths in the first direction for the first sub-pattern to the N-th sub-pattern gradually decrease; the second sub-pattern comprises the second target section; the third sub-pattern comprises the first target section and the second target section.

10. The display substrate according to claim 9, wherein an orthographic projection of the first sub-pattern onto the base comprises a first layout region; orthographic projections for at least a part of the compensation spacers onto the base is uniformly distributed on the first layout region; or,
orthographic projections for a part of the basic spacers onto the base is located at the first layout region, and a layout density of the basic spacers at the first layout region is equal to the layout density of the plurality of basic spacers at the display area.

11. The display substrate according to claim 8, wherein the positive power supply line further comprises: a second common connection part, a plurality of conductive connection parts and two first line entry parts;
at least a portion of the second common connection part extends in the first direction, wherein the second common connection part is located at a side of the first common connection part away from the display area; the second common connection part is coupled to the first common connection part via the plurality of conductive connection parts; and
at least a portion of the first line entry part extends in a second direction that intersects the first direction; the first line entry part is located at a side of the second common connection part away from the display area, and the two first line entry parts are coupled to the second common connection part.

12. The display substrate according to claim 8, wherein the signal line further comprises a negative power supply line, the negative power supply line comprising: a surrounding part and two second line entry parts; the surrounding part partially surrounds the display area, and two end parts of the surrounding part are coupled to the two second line entry parts in one-to-one correspondence; at least a portion of the second line entry part extends in the second direction; the end part of the surrounding part comprises the first target section and the second target section.

13. The display substrate according to claim 12, wherein orthographic projections for a part of the compensation spacers onto the base at least partially overlaps with an orthographic projection of the end part of the surrounding part onto the base.

14. The display substrate according to claim 12, wherein the display substrate further comprises a first barrier and a second barrier, the first barrier surrounds the display area, and the second barrier surrounds the first barrier; and
in the first direction, a first spacing area is provide between an orthographic projection of the first common connection part onto the base and an orthographic projection of the end part of the surrounding part onto the base, wherein the first spacing area is located between an orthographic projection of the first barrier onto the base and an orthographic projection of the display area onto the base; orthographic projections for at least a part of the compensation spacers onto the base is uniformly distributed on the first spacing area.

15. The display substrate according to claim 12, wherein at least a portion of an orthographic projection of the first common connection part onto the base is located between an orthographic projection of the end part of the surrounding part onto the base and an orthographic projection of the display area onto the base; and in the second direction, a second spacing area is provided between at least a portion of the orthographic projection of the first common connection part onto the base and the orthographic projection of the end part of the surrounding part onto the base; orthographic projections for a part of the compensation spacers onto the base is located at the second spacing area.

16. The display substrate according to claim 1, wherein the plurality of compensation spacers comprises a plurality of first compensation spacers and/or a plurality of second compensation spacers, an orthographic projection of each of the plurality of first compensation spacers onto the base does not overlap with an orthographic projection of the signal line onto the base; an orthographic projection of each of the plurality of second compensation spacers onto the base at least partially overlaps with the orthographic projection of the signal line onto the base.

17. The display substrate according to claim 1, wherein the periphery area comprises a bonding area;

the display substrate further comprises a first barrier and a second barrier, wherein the first barrier surrounds the display area, and the second barrier surrounds the first barrier; and the signal line comprises a power supply line, an orthographic projection of the first section of the power supply line onto the base is located between an orthographic projection of the first barrier onto the base and an orthographic projection of the display area onto the base; the first section is adjacent to the bonding area.

18. The display substrate according to claim 17, wherein the display substrate further comprises a scanning line, at least a portion of the scanning line is located at the display area, and the scanning line comprises a portion extending in a first direction;

the power supply line comprises a positive power supply line and a negative power supply line;

an orthographic projection of a side face for a first section of the positive power supply line in the first direction onto the base at least partially overlaps with the orthographic projection of the first periphery area onto the base; and/or an orthographic projection of a side face for a first section of the negative power supply line in the first direction onto the base at least partially overlaps with the orthographic projection of the first periphery area onto the base.

19. The display substrate according to claim 1, wherein the display substrate further comprises a first source-drain metal layer and a second source-drain metal layer, the first source-drain metal layer is located between the second source-drain metal layer and the base; a portion of the signal line is disposed in the same layer and formed by the same material as the first source-drain metal layer, and another portion of the signal line is disposed in the same layer and formed by the same material as the second source-drain metal layer.

20. A display apparatus, comprising the display substrate according to claim 1.

* * * * *